(12) United States Patent
Liu

(10) Patent No.: US 7,586,746 B2
(45) Date of Patent: Sep. 8, 2009

(54) HEAT DISSIPATING DEVICE WITH AIR DUCT

(75) Inventor: Wei-Ji Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 18 days.

(21) Appl. No.: 11/853,840

(22) Filed: Sep. 12, 2007

(65) Prior Publication Data

US 2009/0040717 A1 Feb. 12, 2009

(30) Foreign Application Priority Data

Aug. 6, 2007 (CN) .................. 2007 2 0200785 U

(51) Int. Cl.
*H05K 7/20* (2006.01)
(52) U.S. Cl. ................. 361/695; 361/689; 361/690; 165/80.3; 165/104.33; 174/16.1; 174/16.3
(58) Field of Classification Search ........................ None
See application file for complete search history.

(56) References Cited

U.S. PATENT DOCUMENTS 5,592,363 A * 1/1997 Atarashi et al. ............ 361/689
5,852,547 A * 12/1998 Kitlas et al. ................. 361/695
6,400,568 B1 * 6/2002 Kim et al. ................... 361/697
6,570,760 B1 * 5/2003 Wang ......................... 361/687
6,643,131 B1 * 11/2003 Huang ........................ 361/697
6,678,157 B1 * 1/2004 Bestwick .................... 361/695
6,813,149 B2 * 11/2004 Faneuf et al. .............. 361/687
6,930,882 B2 * 8/2005 Broder et al. ............... 361/695
6,951,446 B2 * 10/2005 Hung ...................... 415/213.1
7,209,352 B2 * 4/2007 Chen .......................... 361/695
7,310,228 B2 * 12/2007 Chen .......................... 361/695
7,342,786 B2 * 3/2008 Malone et al. .............. 361/695
2004/0004812 A1 * 1/2004 Curlee et al. ............... 361/687

* cited by examiner

*Primary Examiner*—Boris L Chervinsky
(74) *Attorney, Agent, or Firm*—Frank R. Niranjan

(57) ABSTRACT

A heat dissipating device used for dissipating heat from a heat generating device (100) in a computer. The heat dissipating device includes a fan bracket (20), a fan (27) received in the fan bracket, and an air duct (50). The fan bracket defines a fan opening (25), and has a supporting member (233). The supporting member has a flat board (2333). A pair of retaining portions (2335) is formed on opposite edges of the flat board respectively. The flat board defines a retaining hole (2337) therein. The air duct defines an airflow passageway and has a top wall (51) and two opposite sidewalls extending from the top wall. A securing member (553) extends from one of the sidewalls is retained between the two retaining portions. A post (5535) protruding from the securing member is engaged in the retaining hole for cooperatively retaining the air duct to the fan bracket.

13 Claims, 6 Drawing Sheets

HEAT DISSIPATING DEVICE WITH AIR DUCT

BACKGROUND OF THE INVENTION

1. Field of the Invention

The present invention relates to a dissipating device, and more particularly to a heat dissipating device with air duct.

2. Description of Related Art

It is a common technique to use fans in a variety of industrial equipment for heat dissipation, especially in widely used electronic products. With the increase of various applications, the number of electronic modules installed in one single electronic product also increases. Based on the design consideration of space, the electronic modules are usually stacked vertically in a housing of an electronic product. For example, there are many electronic modules (such as storage devices) existing in an industrial computer or server. In considerations of providing sufficient data storage the electronic product such as an industrial computer or a server frequently needs two or more data storage devices so as to satisfy specific requirements.

Since the number of the electronic modules is high, a plurality of fan modules (such as four fan modules) have to be installed in the electronic product, to effectively dissipate heat in the electronic modules. But, sometimes due to a layout of the electronic modules in the electronic product, the electronic modules may be positioned far away from the fan module. This may lead to failure of the electronic modules due to over-heating.

Therefore, there is a need to develop a housing of an electronic product having an air-flow guiding device, thereby promoting efficient heat-dissipation.

What is needed, therefore, is a heat dissipating assembly with an air duct for dissipating heat from a heat generating device.

SUMMARY

A heat dissipating device used for dissipating heat from a heat generating device in a computer. The heat dissipating device includes a fan bracket, a fan received in the fan bracket, and an air duct. The fan bracket defines a fan opening, and has a supporting member. The supporting member has a flat board. A pair of retaining portions is formed on opposite edges of the flat board respectively. The flat board defines a retaining hole therein. The air duct defines an airflow passageway and has a top wall and two opposite sidewalls extending from the top wall. A securing member extends from one of the sidewalls is retained between the two retaining portions. A post protruding from the securing member is engaged in the retaining hole for cooperatively retaining the air duct to the fan bracket.

Other advantages and novel features of the present invention will become more apparent from the following detailed description of a preferred embodiment when taken in conjunction with the accompanying drawings, in which:

DETAILED DESCRIPTION OF THE EMBODIMENT

Figure 1:
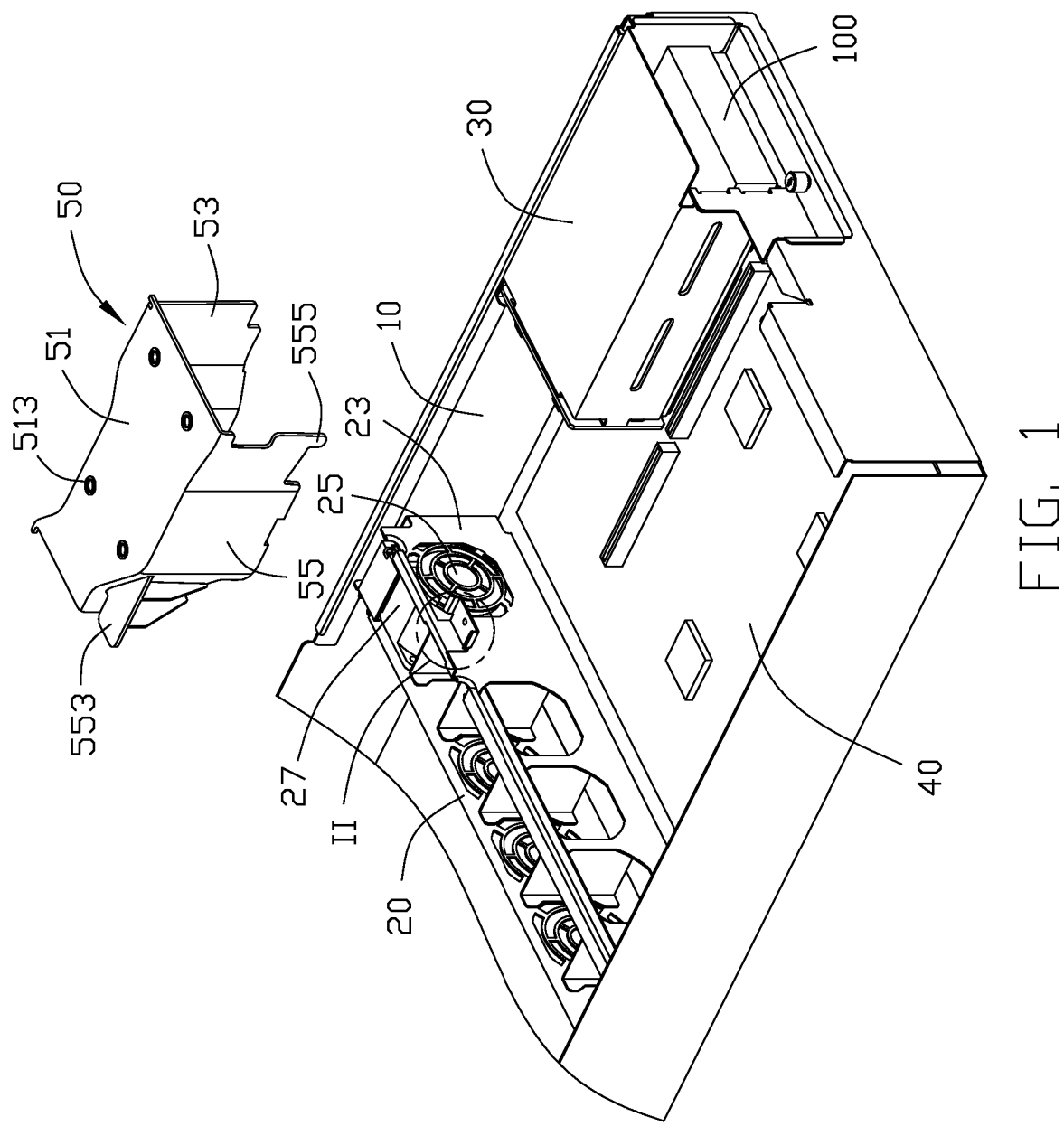
FIG. 1 is a partially exploded, isometric view of a heat dissipating device of a preferred embodiment of the present invention, the heat dissipating device including a chassis, a fan assembly, a motherboard, an air duct, and a heat generating device.

Referring to FIG. 1, a heat dissipating device includes a fan assembly, and an air duct 50 for dissipating heat from a heat generating device 100 in a chassis 10. The fan assembly includes a fan bracket 20 and a plurality of fans 27. The heat generating device 100 such as a data storage device is mounted in a disk bracket 30 attached to a motherboard 40.

Figure 2:
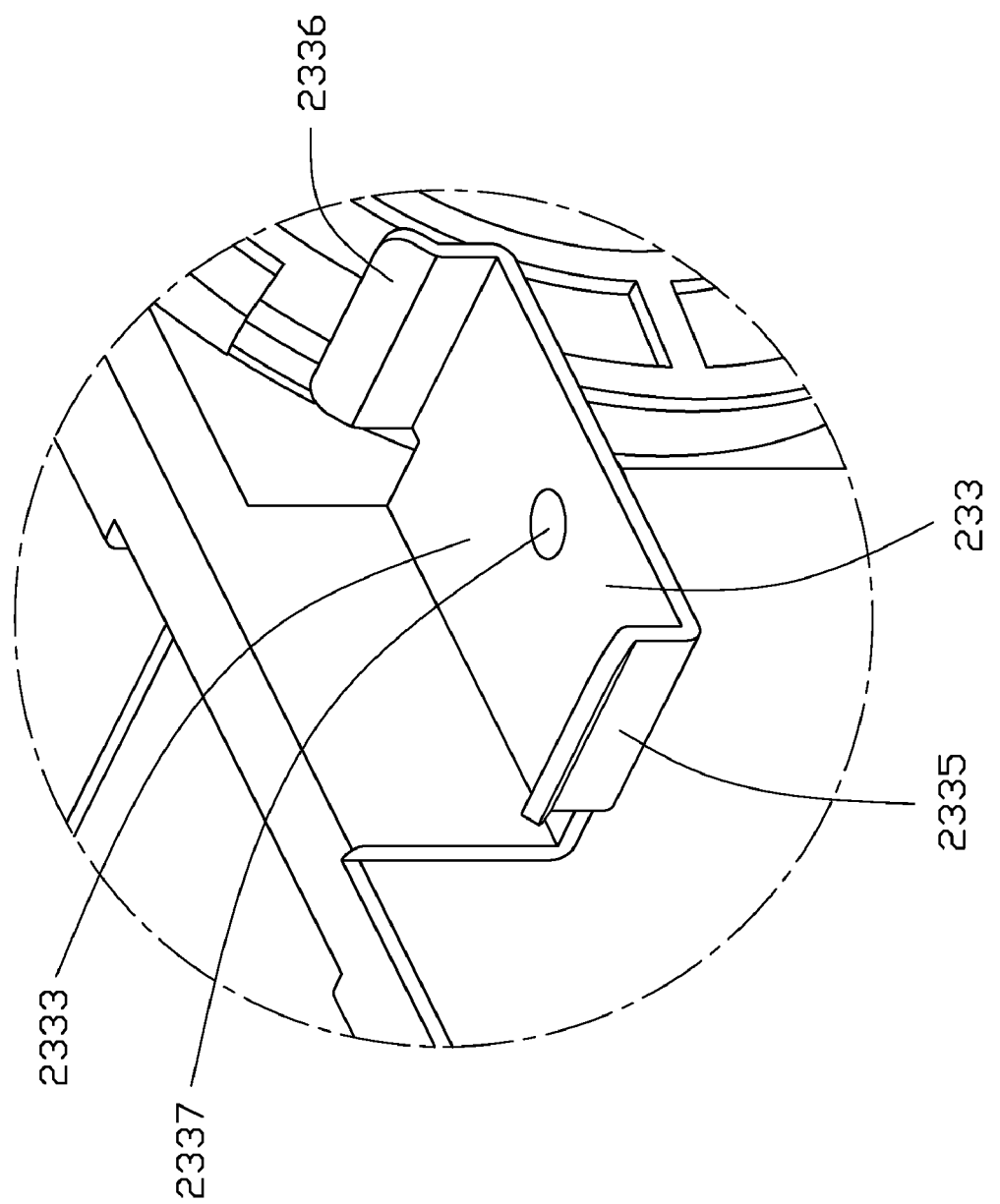
FIG. 2 is an enlarged view of the circled portion 11 of FIG. 1.

Referring also to FIG. 2, the fan bracket 20 includes a pair of retaining boards 23, and defines a plurality of retaining spaces for receiving the fans 27. Each retaining space has two fan openings 25 for blowing air therethrough. A supporting member 233 is formed on one of the retaining boards 23. The supporting member 233 has a flat board 2333, and a pair of retaining portions 2335 extending up from two opposite sides of the flat board 2333 respectively. A retaining hole 2337 is defined in the flat board 2333. Each retaining portion 2335 has a slanted guiding flange 2336.

Figure 3:
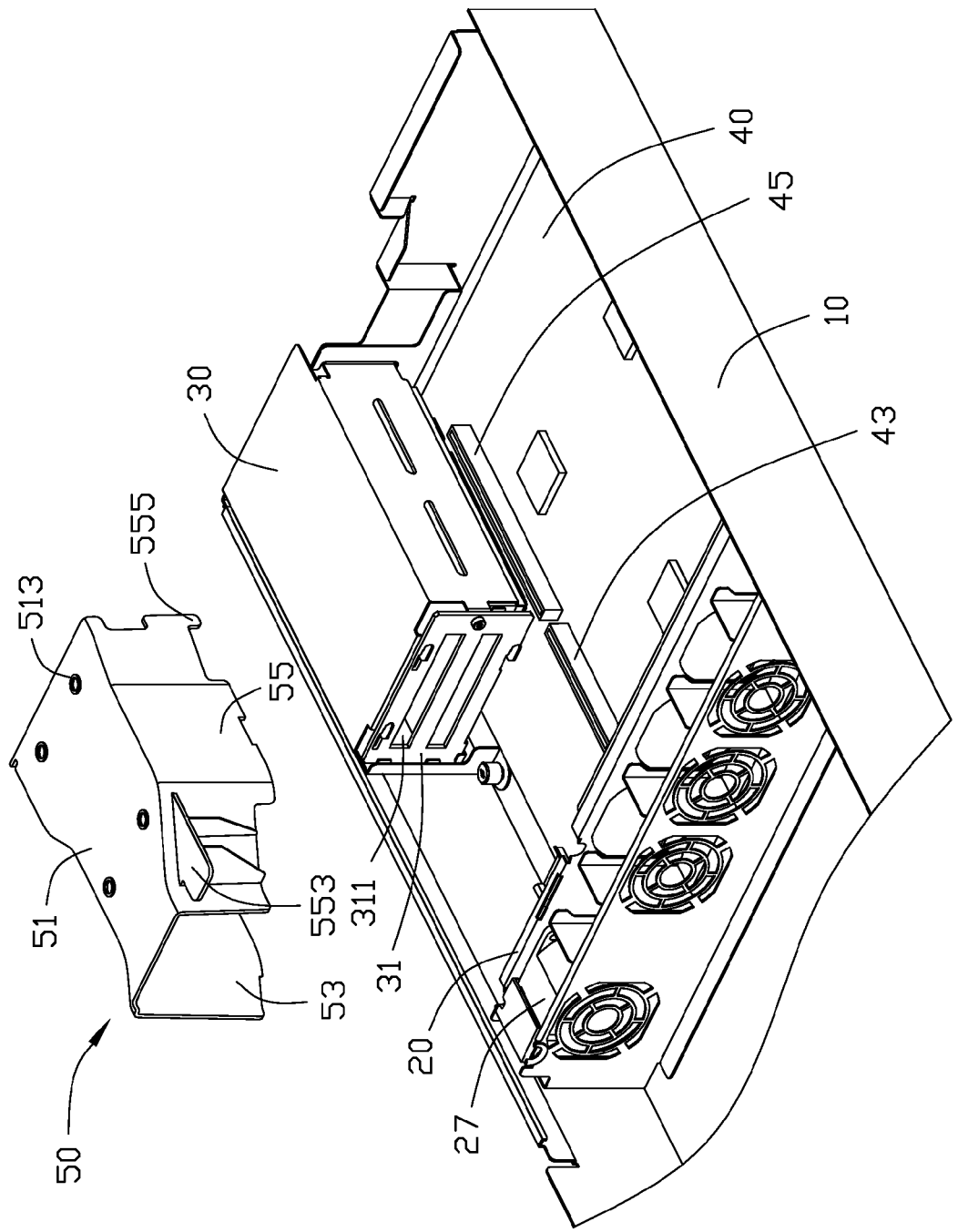
FIG. 3 is similar to FIG. 1, but viewed from another aspect.
Figure 4:
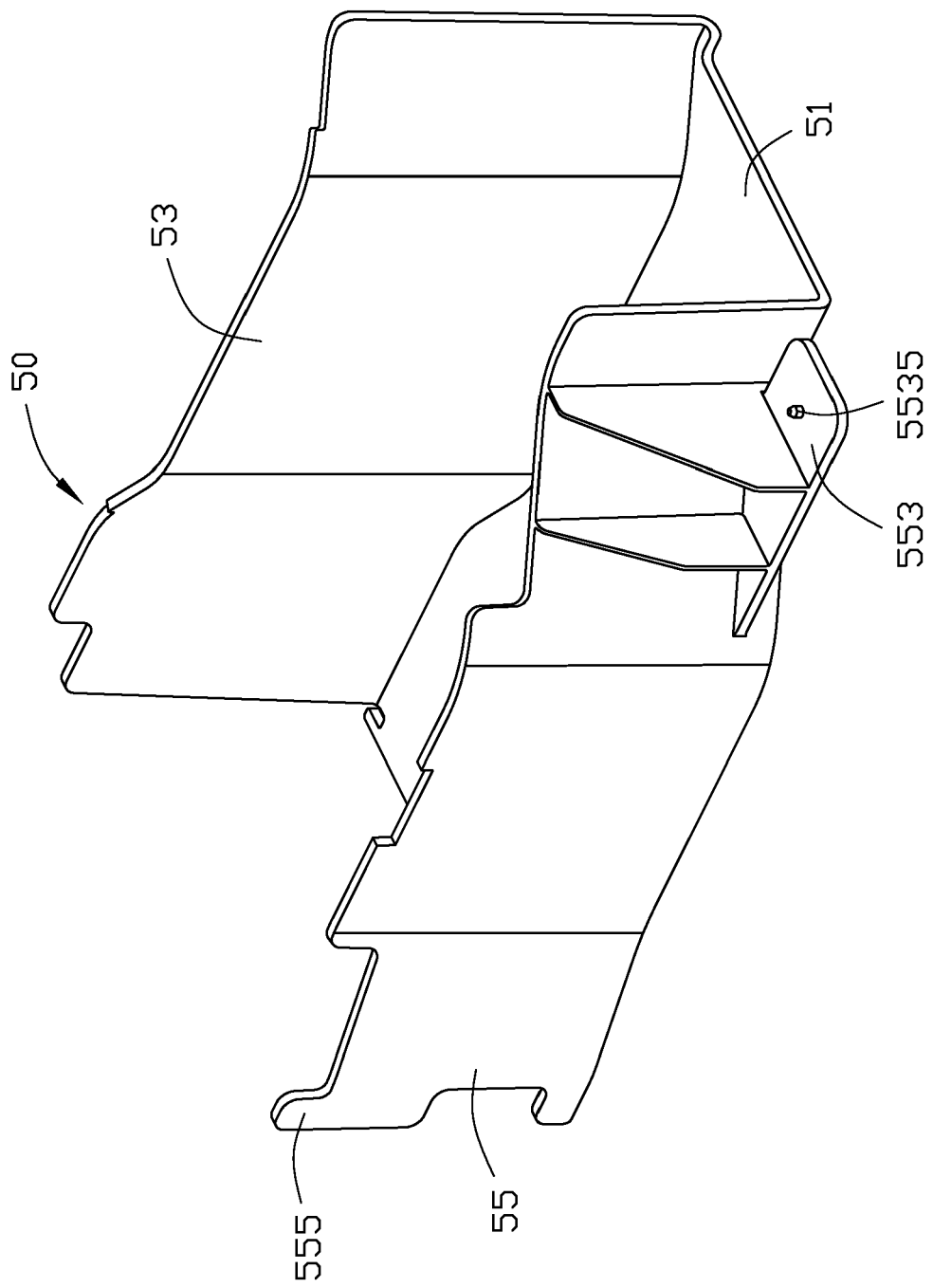
FIG. 4 is an enlarged view of the air duct of FIG. 1, but viewed from another aspect.

Referring also to FIG. 3 and FIG. 4, the air duct 50 defines an airflow passageway with a flat top wall 51, and a pair of sidewalls 53 and 55 extending down from two opposite edges of the top wall 51. The passageway has an inlet facing the fan assembly and an outlet facing the heat generating device 100. The outlet is wider than the inlet. A plurality of gaskets 513 is formed on the top wall 51 of the air duct 50. A securing member 553 extends from the sidewall 55 towards the fan assembly. A post 5535 protrudes form a bottom surface of the securing member 553 corresponding to the retaining hole 2337 of the supporting member 233. The sidewall 55 has a foot 555 at one side of thereof.

The motherboard 40 is disposed within the chassis 10 with two extension connectors 43 and 45 formed thereon. The disk bracket 30 is positioned on the motherboard 40. The disk bracket 30 has a sidewall 31 facing the fan bracket 20. The sidewall 31 defines a plurality of slots 311 therein.

Figure 5:
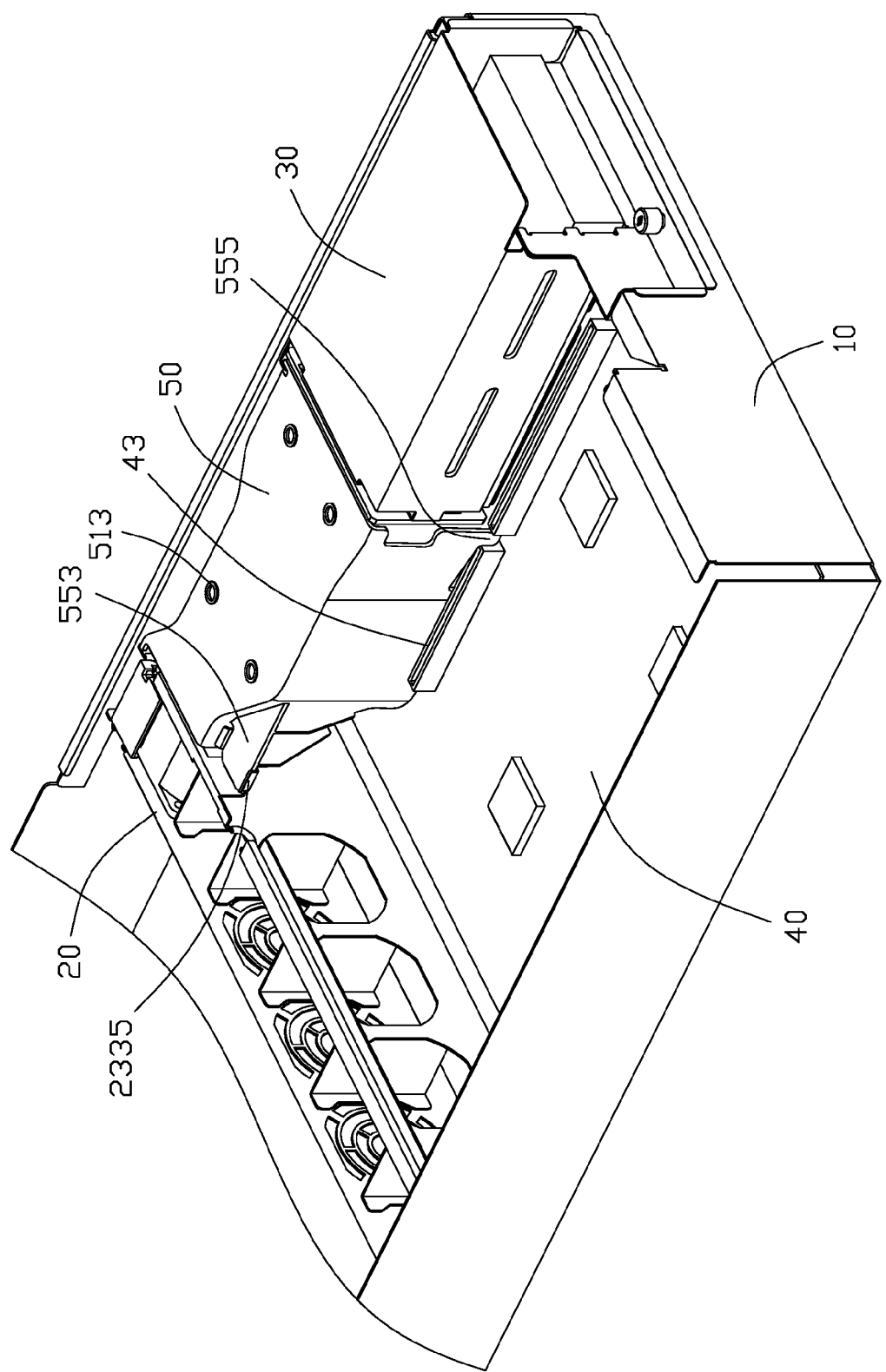
FIG. 5 is an assembled view of FIG. 1.
Figure 6:
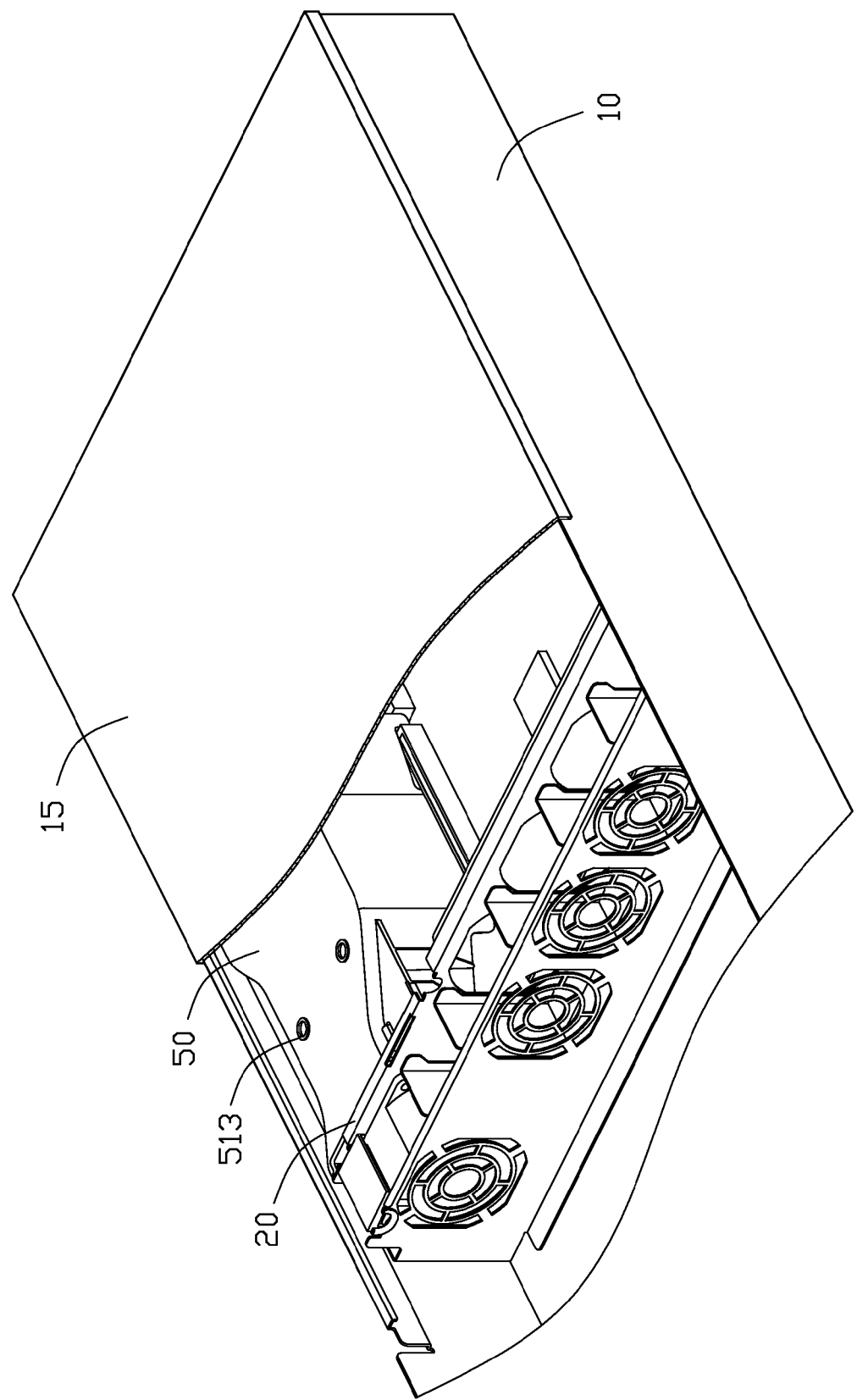
FIG. 6 is an assembled view of FIG. 3 with a cover.

Referring also to FIG. 5 and FIG. 6, when assembling the heat dissipating device to the chassis 10, the fan bracket 20 is mounted adjacent to the motherboard 40. The fan 27 is mounted to the fan bracket 20. Then the air duct 50 is fitted to the chassis 10 from up-to-down with the inlet coupled to the fan bracket 20 and the outlet coupled to the disk bracket 30. When the air duct 50 is totally received in the chassis 10, the securing member 553 is retained between the retaining portions 2335 of the supporting member 233 and the post 5535 is received in the retaining hole 2337. The slanted guiding flange 2336 is facilitated to guide the securing member 553 to seat on the flat board 2333, so that the cost 5535 of the securing member 553 can be therefore received in the corresponding retaining hole 2337. The foot 555 of the air duct 50 is sandwiched between the two extension connectors 43 and 45 for further retaining the air duct 50. A top cover 15 is provided for covering the chassis 10. The top cover 15 abuts against the gaskets 513 of the air duct 50 for preventing the air duct 50 from moving upwards.

What is claimed is:

1. A heat dissipating device for dissipating heat from a heat generating device in a computer, the heat dissipation device comprising:

a fan bracket defining a fan opening, the fan bracket having a supporting member, the supporting member having a flat board and a pair of retaining portions formed on opposite edges of the flat board respectively, the flat board defining a retaining hole therein;

a fan received in the fan bracket adjacent to the fan opening; and an air duct defining an airflow passageway, the air duct having a top wall and opposite sidewalls extending from the top wall, a securing member extending from one of the sidewalls retained between the two retaining portions, and a post protruding from the securing member engaged in the retaining hole.

2. The heat dissipating device as described in claim 1, wherein each retaining portion has a slanted guiding flange for facilitating guiding the securing member to seat on the flat board.

3. The heat dissipating device as described in claim 1, wherein the passageway has an inlet facing the fan opening and an outlet facing the heat generating device, and the outlet is wider than the inlet.

4. The heat dissipating device as described in claim 1, wherein a plurality of gaskets is formed on the top wall of the air duct.

5. A computer heat dissipating assembly comprising:
a chassis;
a motherboard positioned in the chassis;
a fun bracket mounted in the chassis adjacent to the motherboard, the fan bracket having a supporting member the supporting member having a flat board and a pair of retaining portions formed on opposite edges of the flat board respectively;
a heat generating device arranged on the motherboard;
a fan received in the fan bracket for blowing air toward the heat generating device;
an air duct retained between the fan bracket and the heat generating device with an airflow passageway for guiding air therethrough, a securing member formed on the air duct being retained on the supporting member by the two retaining portions; and
a top cover abutting against the air duct for preventing the air duct from moving upwards, wherein the air duct has a top wall, and two sidewalls extending from two opposite edges of the top wall respectively, and the securing member extends from one of the sidewalls.

6. The computer heat dissipating assembly as described in claim 5, wherein the flat board defines a retaining hole, and the securing member has a post extending through the retaining hole for securely retaining the air duct.

7. The computer heat dissipating assembly as described in claim 5, wherein each retaining portion has a slanted guiding flange for facilitating guiding the securing member to seat on the flat board.

8. The computer heat dissipating assembly as described in claim 5, wherein the passageway has an inlet facing the fan bracket and an outlet facing the heat generating device, and the outlet is wider than the inlet.

9. The computer heat dissipating assembly as described in claim 5, wherein a plurality of gaskets is formed on the top wall abutting against the top cover.

10. The computer heat dissipating assembly as described in claim 5, wherein the motherboard has two extension connectors, and the air duct has a foot retained between the two extension connectors for mounting the air duct to the motherboard.

11. A computer comprising:
an enclosure having a bottom panel and a top panel;
a motherboard mounted on the bottom panel;
a fan housing mounted in the enclosure adjacent to the motherboard, the fan housing having a sidewall with an opening defined therein, a supporting member formed on the sidewall, the supporting member having a flat board and a pair of retaining portions formed on opposite edges of the flat board respectively, a retaining hole defined in the flat board, and each retaining portion having a slanted guiding flange;
a disk drive bracket arranged on the motherboard;
a fan received in the fan housing adjacent to the opening for blowing air toward the disk drive bracket; and
an air duct arranged between the fan housing and the disk drive on the motherboard, the air duct and the motherboard cooperatively forming a channel for guiding air to flow therethrough, a securing member formed on the air duct being retained on the supporting member by the two retaining portions, and the securing member having a post extending through the retaining hole for securely retaining the air duct;
wherein the slanted guiding flange is facilitated to guide the securing member to seat on the flat board, so that the post of the securing member can be therefore received in the corresponding retaining hole.

12. The computer as described in claim 11, wherein the air duct is sandwiched between the top panel and the motherboard.

13. The computer as described in claim 11, wherein the channel has an inlet coupled to the opening of the fan housing and an outlet coupled to the disk drive bracket, and the outlet is wider than the inlet.

\* \* \* \* \*